United States Patent [19]
Fujishima et al.

[11] Patent Number: 5,445,997
[45] Date of Patent: Aug. 29, 1995

[54] PATTERNING METHOD

[75] Inventors: Akira Fujishima, 710-5, Nakamaruko, Nakahara-ku, Kawasaki-shi; Shigeo Kondo, Hirakata, both of Japan

[73] Assignees: Matsushita Electric Industrial Co., Ltd., Kadoma; Akira Fujishima, Kanagawa, both of Japan

[21] Appl. No.: 134,470

[22] Filed: Oct. 12, 1993

Related U.S. Application Data

[63] Continuation of Ser. No. 725,506, Jul. 3, 1991, abandoned.

[30] Foreign Application Priority Data

Jul. 6, 1990 [JP] Japan .................. 2-180054

[51] Int. Cl.⁶ .......................... H01L 21/465
[52] U.S. Cl. .................. 437/228; 437/173; 437/101
[58] Field of Search ............... 156/643; 437/173, 228

[56] References Cited

U.S. PATENT DOCUMENTS

| | | | |
|---|---|---|---|
| 3,950,570 | 4/1976 | Kenney | 430/311 |
| 4,401,367 | 8/1983 | Grantham et al. | |
| 4,414,066 | 11/1983 | Forrest et al. | 204/129.3 |
| 5,081,002 | 1/1992 | Ruberto et al. | 430/297 |
| 5,126,921 | 6/1992 | Fujishima et al. | 361/525 |
| 5,238,529 | 8/1993 | Douglas | 156/643 |
| 5,312,516 | 5/1994 | Douglas | 156/643 |

FOREIGN PATENT DOCUMENTS

| | | |
|---|---|---|
| 0037876 | 2/1982 | European Pat. Off. |
| 91111218 | 5/1992 | European Pat. Off. |
| 9013139 | 11/1990 | WIPO |

OTHER PUBLICATIONS

"Laser–Induced Metal . . . Electrolytes" by L. Nanai et al. 320 *Applied Phy. Lett.* 54, Feb. 20, 1989, No. 8, pp. 736–738 (New York).

"Selective Photoetching of n-GaAs/ZnSe Heterostructures" by J. Van de Ven 6064 *Mater. Lttr.* 7, Mar. 1989, No. 12, pp. 468–472 (Amsterdam, NL).

"Localized Photoactivation with Pd of p-InP . . . Plating", by G. Stremsdoerfer et al., *Jour. of the Ele. Society*, 133, Apr. 1986, NO. 4, pp. 851–852 (Manchester, N.H.).

"Neg. Photo. Etch. Syst." by W. Moreau, *IBM Tech. Dis. Bulletin*, vol. 13, No. 3, pp. 794 (Aug. 1970).

"Photo–Electrochemically–Induced . . . Patterning" by Jan W. M. Jacobs et al., 1046 *Journal of the Ele. Soc.* 36, No. 12, Dec. 1989 (Manchester, N.H.).

"Effect of Carrier . . . Heterostructures" by M. N. Ruberto et al., *Appl. Physl. Letter* 55, No. 10, Sep. 4, 1989 (New York).

*Primary Examiner*—R. Bruce Breneman
*Assistant Examiner*—Linda J. Fleck
*Attorney, Agent, or Firm*—Ratner & Prestia

[57] ABSTRACT

A patterning method which comprises forming a photosensitive inorganic semiconductor layer on a semiconductor substrate and irradiating the photosensitive inorganic semiconductor layer which is kept in contact with an electrolyte with light of energy greater than the band gap of the semiconductor layer. Thus, a portion of the semiconductor layer which has been exposed or unexposed to light is dissolved into the electrolyte, thereby producing a desired pattern on the substrate.

4 Claims, 8 Drawing Sheets

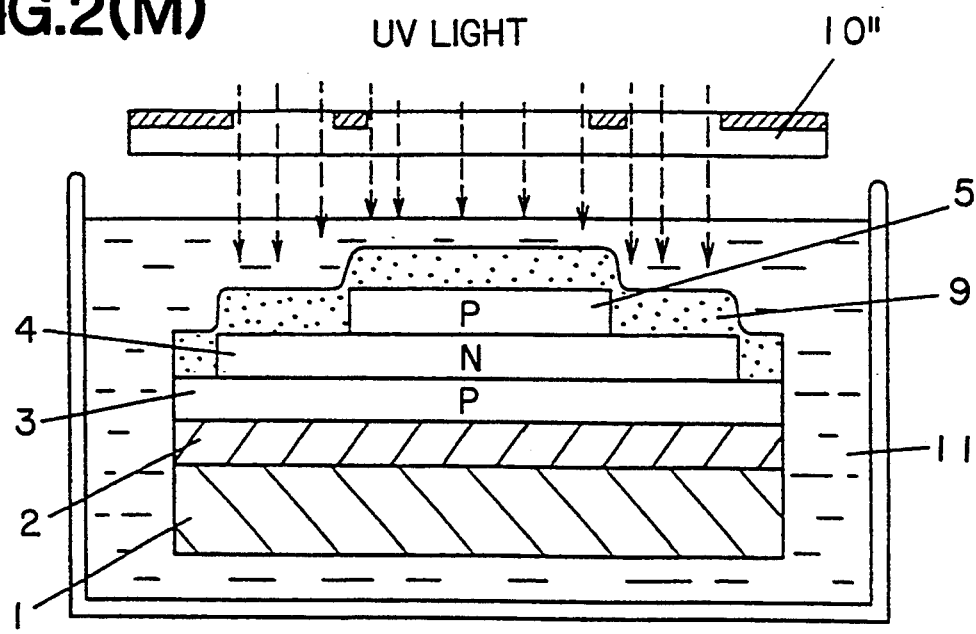
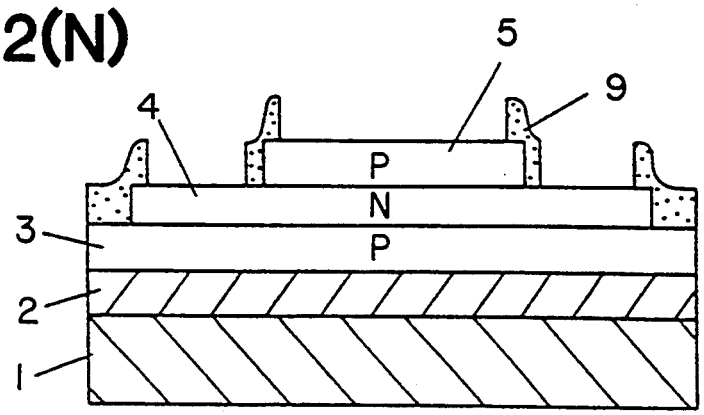
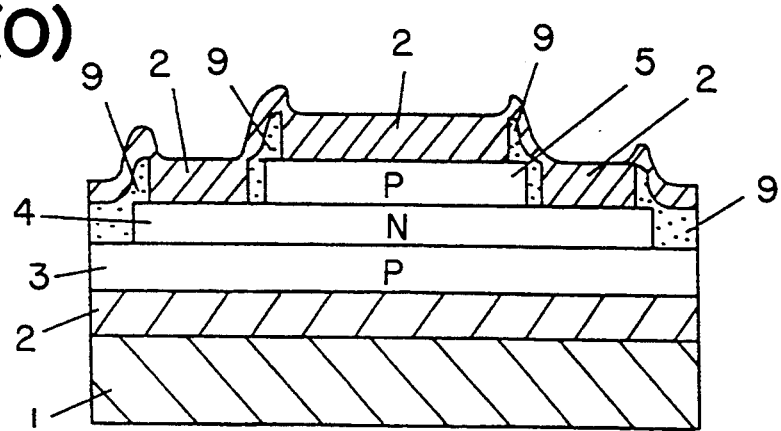

PATTERNING METHOD

This application is a continuation of application Ser. No. 07/725,506 filed Jul. 3, 1991.

BACKGROUND OF THE INVENTION

1. Field of the Invention

The present invention relates to a patterning method, more particularly to a method for forming an etching pattern, a wiring pattern, and the like required in a semiconductor manufacturing process.

2. Description of the Prior Art

In a semiconductor manufacturing process, fine patterning is required for precise etching or wiring on a semiconductor, an insulation, or the like. Such fine patterning is generally performed by using an organic photoresist.

In the conventional patterning using an organic photoresist, a large amount of volatile solvents having a low boiling point, such as acetone, isopropyl alcohol, toluene, xylene, Freon (trademark), and the like, are used when the resist is applied or removed. As a result, careful control for exhaust gas is required in the process using these solvents. In particular, in recent years, the atmospheric pollution by exhaust gas, especially by Freon (trademark), has given rise to a problem on a global scale.

To minimize use of the organic solvents, a technique of utilizing a water-soluble photopolymer as a photoresist has been developed. However, such a resist made of a water-soluble photopolymer does not provide high resolution, restricting its application to a small part of the semiconductor manufacturing process. Consequently, use of an organic photoresist is still indispensable to patterning in the semiconductor manufacturing process.

SUMMARY OF THE INVENTION

The patterning method of this invention, which overcomes the above-discussed and numerous other disadvantages and deficiencies of the prior art, comprises the steps of forming a photosensitive inorganic semiconductor layer on a semiconductor substrate and irradiating the photosensitive inorganic semiconductor layer which is kept in contact with an electrolyte with light having energy greater than the band gap of the photosensitive inorganic semiconductor layer to form a pattern.

In a preferred embodiment, the electrolyte is an electroless plating catalytic solution.

In a preferred embodiment, the electrolyte is a polymer electrolyte.

In a preferred embodiment, the pattern is an etching pattern.

In a preferred embodiment, the pattern is a wiring pattern.

The photosensitive inorganic semiconductor includes a p-type semiconductor and an n-type semiconductor. When light having energy greater than the band gap is radiated on the semiconductor, the radiated light energy is charge-separated into holes and electrons inside the semiconductor. When this separation is brought about within an electrolyte, the holes or electrons formed on the surface of the semiconductor can cause the reaction of opto-electrochemical oxidation or reduction. Utilizing this reaction, electrodes of various configuration can be formed.

Thus, the present invention is capable of providing a method for forming a variety of patterns on a semiconductor without using an organic photoresist or an organic solvent, contributing to solving problems such as atmospheric pollution.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

The patterning method of this invention, taking the case of using an n-type semiconductor, is described below.

First, an n-type semiconductor layer such as zinc oxide as a photosensitive material is formed on a semiconductor substrate. Then, the substrate layered with the n-type semiconductor layer is immersed in an electroless plating catalytic solution such as an aqueous solution of palladium chloride, and then irradiated with light having energy greater than the band gap of the n-type semiconductor layer so that a desired pattern is obtained. In the light-exposed portion of the semiconductor layer, charges are separated to generate holes and electrons. The holes generated act to oxidize the semiconductor, causing most of the semiconductor to dissolve into the electrolyte by opto-electrochemical reaction. At the same time, an electroless plating catalyst such as palladium (Pd) is deposited on the portion of the semiconductor layer which has not been exposed to light. Then, as a final stage, deposition of conductive metal such as gold, copper or nickel in an electroless plating solution is performed to complete the formation of the desired pattern.

Normally, in the case of deposition of Pd on a metal oxide semiconductor, sensitizing is performed prior to the Pd deposition, in which a sensitizer including tin chloride or the like is attached to the surface of the semiconductor on which Pd is later deposited. Without the existence of tin, favorable Pd deposition will not be possible.

In the above case, a different kind of metal is deposited on the portion of the n-type semiconductor of zinc oxide remained undissolved into the electrolyte after the opto-electrochemical reaction. The n-type semiconductor used as a photosensitive material in this process is not limited to zinc oxide but can be selected from others as required.

Also, a p-type semiconductor such as indium phosphide (InP) and strontium titanate can also be used as a photosensitive material to attain basically the same effect as, though showing the opposite reaction to the case of the n-type semiconductor, which should be considered within the scope of this invention. That is, the p-type semiconductor is reduced at the interface between the semiconductor and the electrolyte, while the n-type semiconductor is oxidized. Therefore, when the p-type semiconductor is used, an electrolyte material can directly be deposited on a light-exposed portion of the semiconductor.

The inorganic semiconductor is a photosensitive material is preferably formed by thermal decomposition from an organic metal compound in view of its tight contact with the substrate.

Next, the present invention is described by way of examples with reference to the drawings.

EXAMPLE 1

Figure 1:
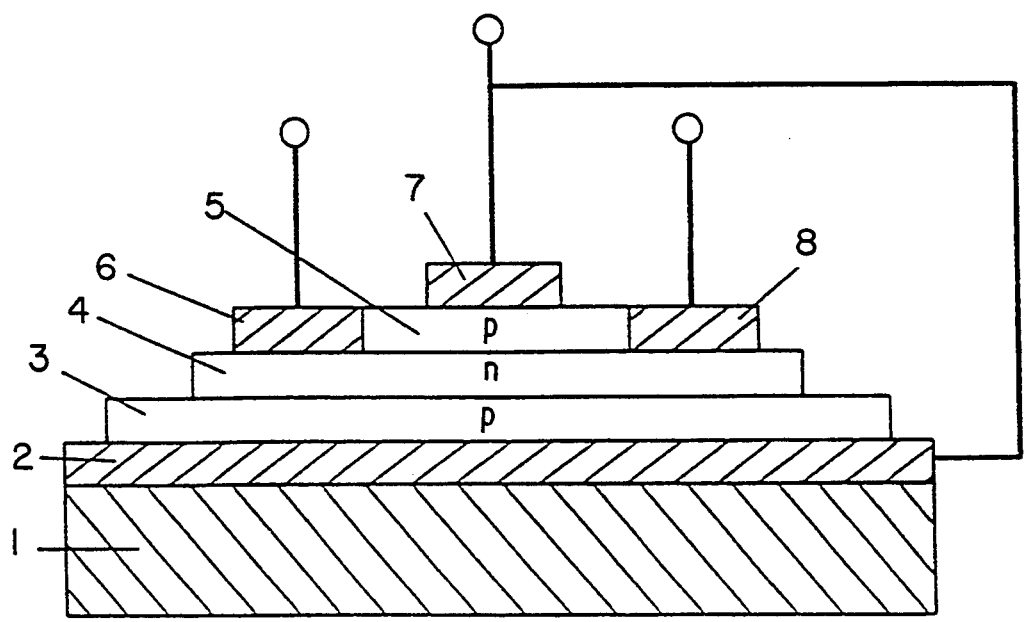
FIG. 1 is a sectional view illustrating a structure of a field effect transistor manufactured by the patterning method of the present invention.

FIG. 1 is a sectional view of a field effect transistor manufactured by using the patterning method of this invention to form an etching pattern on a substrate.

The field effect transistor comprises a ceramic insulating substrate 1 and a conductive metal layer 2 made of gold, for example, formed thereon. A p-type silicon layer 3 and an n-type silicon layer 4 are formed on the conductive metal layer 2 in this order. On the n-type silicon layer 4, a p-type silicon layer 5 is formed. A source electrode 6 and a drain electrode 8, both made of conductive metal such as gold, are also formed on the n-type silicon layer 4 to interpose the p-type silicon layer 5. Also, a gate electrode 7 made of conductive metal such as gold is disposed on the p-type silicon layer 5.

Figure 2A:
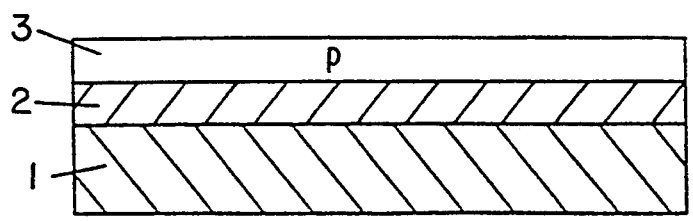
FIGS. 2(A) to 2(O) are sectional views illustrating the steps of the manufacturing process of the field effect transistor of FIG. 1, respectively.

A manufacturing process of the field effect transistor of the above construction is shown in a series of FIGS. 2(A) to 2(O). Referring to FIG. 2(A), gold as the conductive metal layer 2 was deposited on the ceramic insulating substrate 1 by evaporation, and the p-type silicon layer 3 was formed on the conductive metal layer 2 by CVD.

Figure 2B:
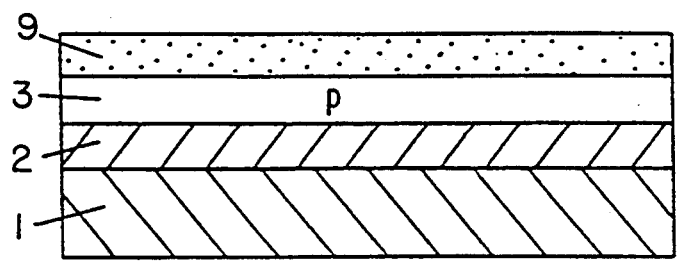

Then, as illustrated in FIG. 2(B), a photosensitive n-type semiconductor layer 9 made of tungsten oxide was formed on the p-type silicon layer 3.

Figure 2C:
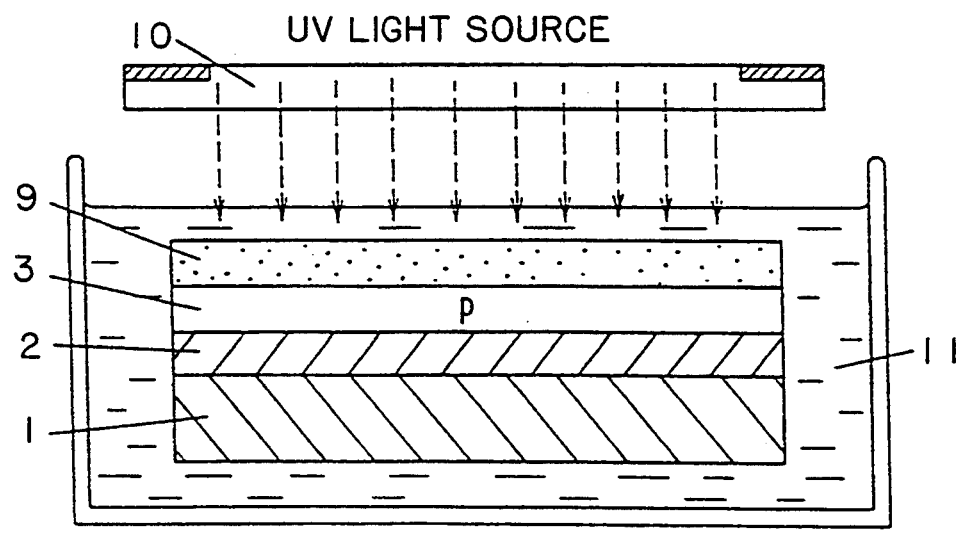

The thus formed multilayer body composed of the insulating substrate 1, the conductive metal layer 2, the p-type silicon layer 3, and the photosensitive n-type semiconductor layer 9 was immersed in an electrolyte 11 which was a dilute sulfuric acid solution as shown in FIG. 2(C). Keeping the entire body within the electrolyte 11, a photomask 10 was tightly contacted to the n-type semiconductor layer 9. The photomask 10 was formed so that light be radiated therethrough onto a portion of the photosensitive n-type semiconductor layer 9 which was desired to be removed. Then, light having energy greater than the band gap of the photosensitive n-type semiconductor layer 9, such as ultraviolet light from a xenon lamp, was radiated on the photomask 10.

Figure 2D:
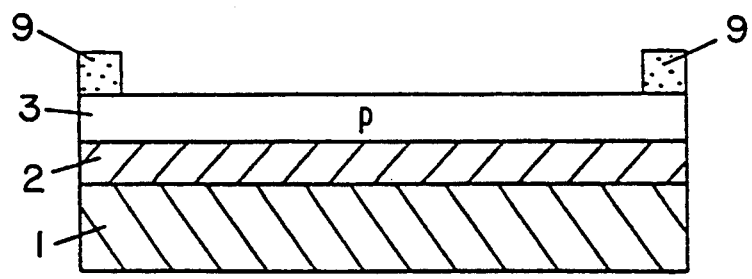
Figure 2E:
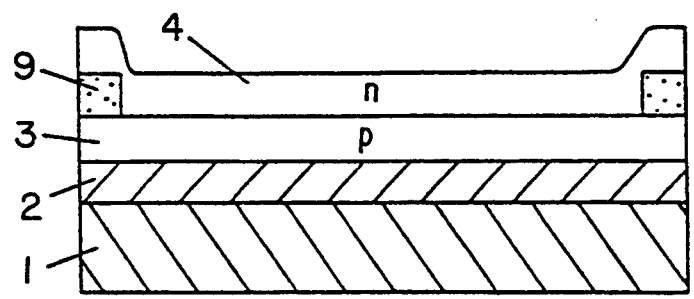

As a result, as shown in FIG. 2(D), only the portion of the photosensitive n-type semiconductor layer 9 made of tungsten oxide which had been exposed to the ultraviolet light was dissolved into the electrolyte 11, allowing the desired portion of the surface of the p-type silicon layer 3 to make an appearance. The thus formed multilayer body was then cleaned with distilled water and dried before the n-type silicon layer 4 was formed over the body by CVD as shown in FIG. 2(E).

Figure 2F:
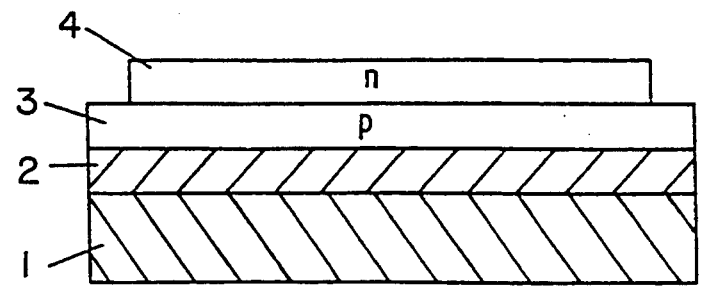

Then, the remaining portion of the photoconductive n-type semiconductor layer 9 was removed by an alkaline cleaning solution, resulting in producing the desired pattern of the n-type silicon layer 4 as shown in FIG. 2(F).

Figure 2G:
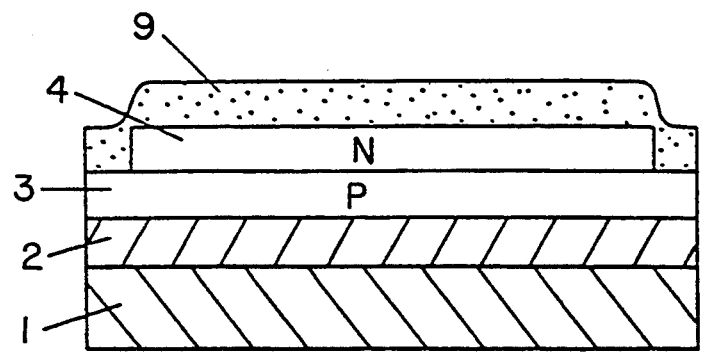
Figure 2H:
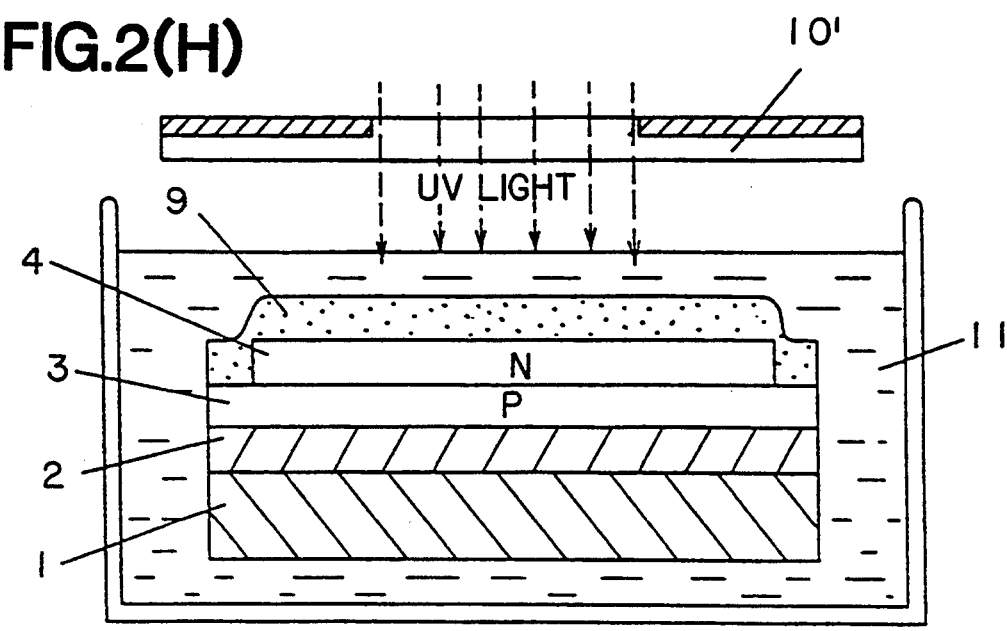

After the entire body shown in FIG. 2(F) was cleaned with distilled water and dried, the photosensitive n-type semiconductor layer 9 of tungsten oxide was formed again on the n-type silicon layer 4 and the exposed p-type silicon layer 3 by evaporation as shown in FIG. 2(G). Then, as shown in FIG. 2(H), while the thus formed body was kept immersed in the electrolyte 11, a photomask 10' having a desired pattern was tightly contacted to the photosensitive n-type semiconductor layer 9, and ultraviolet light was radiated on the photomask 10' to obtain the same desired pattern on the photosensitive n-type semiconductor layer 9.

Figure 2I:
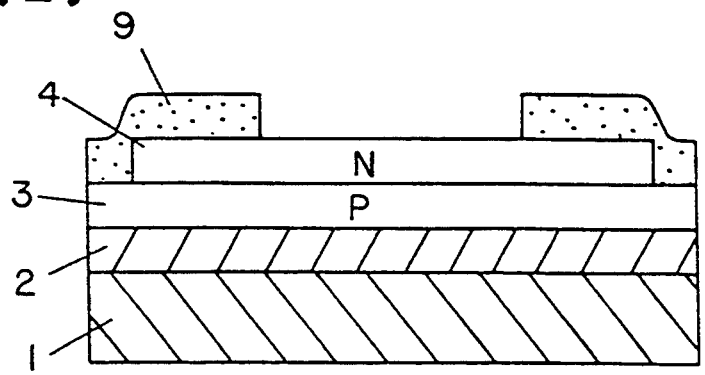

As a result, as shown in FIG. 2(I), only the portion of the photosensitive n-type semiconductor layer 9 which had been exposed to the ultraviolet light was dissolved into the electrolyte 11, allowing the desired portion of The surface of the n-Type silicon layer 4 to make an appearance.

Figure 2J:
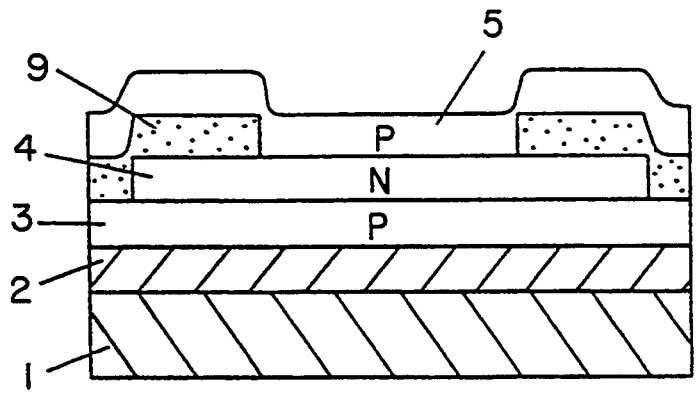
Figure 2K:
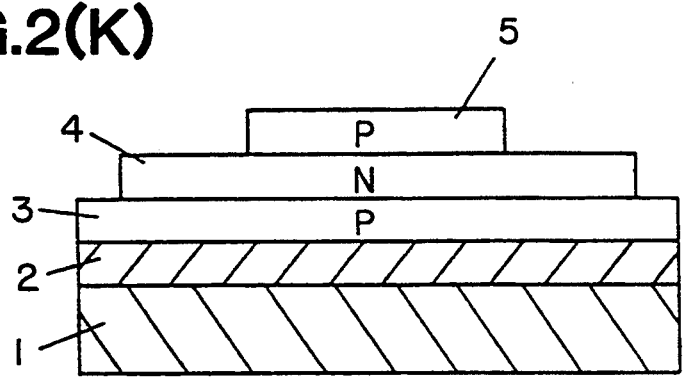

Next, the p-type silicon layer 5 was formed over the exposed surface of the n-type silicon layer 4 and the photosensitive n-type semiconductor layer 9 by CVD as shown in FIG. 2(J). Then, the remaining portion of the photoconductive n-type semiconductor layer 9 was removed with an alkaline solution, resulting in producing the desired pattern of the p-type silicon layer 5 as shown in FIG. 2(K).

Figure 2L:
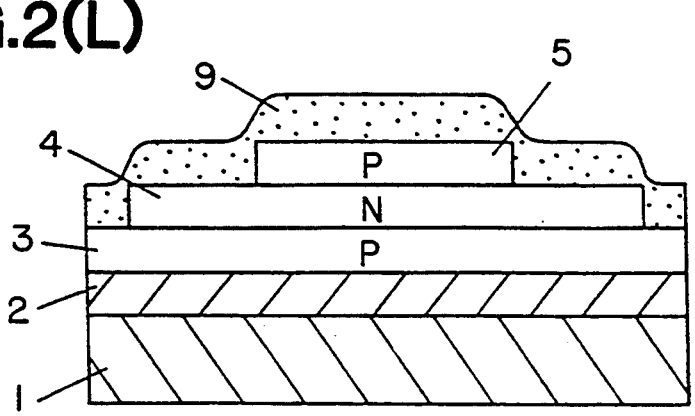

Then, as shown in FIG. 2(L), the photosensitive n-type semiconductor layer 9 of tungsten oxide was formed over the p-type silicon layer 5 and the respective exposed portions of the n-type silicon layer 4 and the p-type silicon layer 3. Then, as shown in FIG. 2(M), while the entire body shown in FIG. 2(L) was kept immersed in the electrolyte 11, a photomask 10" having a desired pattern was tightly contacted to the photosensitive n-type semiconductor layer 9 and ultraviolet light was radiated on the photomask 10" to obtain the formation shown in FIG. 2(N).

After the thus formed body was sufficiently cleaned with distilled water and dried, gold as the conductive metal was deposited by evaporation over the exposed surface of the body, as shown in FIG 2(O), and then the remaining tungsten oxide was removed by the alkaline solution, to obtain the field effect transistor of the shape shown in FIG. 1.

Figure 3:
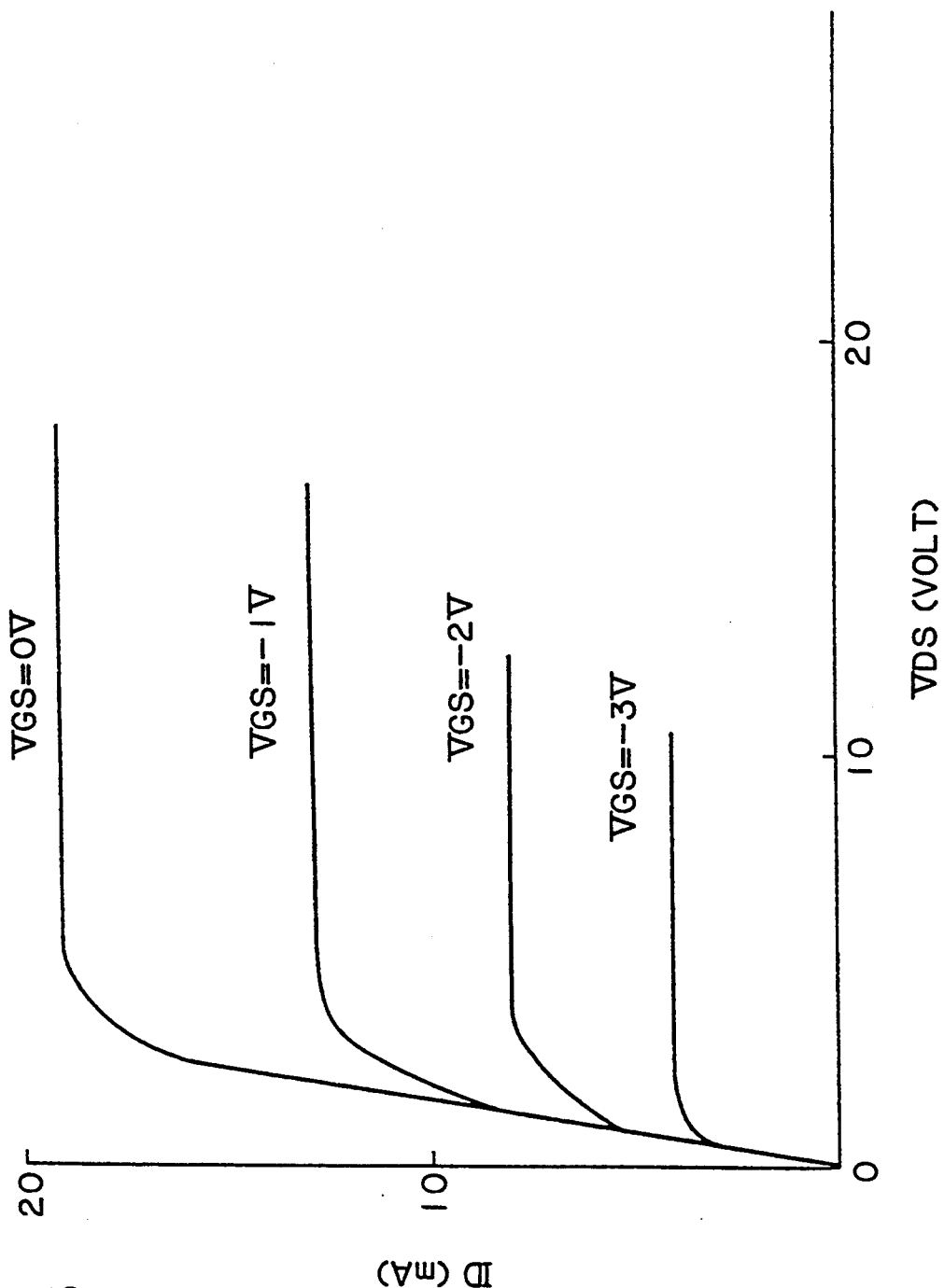
FIG. 3 is a graph showing the characteristics of the field effect transistor manufactured according to the process of FIGS. 2(A) to 2(O)

The resulting characteristics of the field effect transistor of this example are shown as a graph in FIG. 3, which indicates the relationship between a voltage $V_{DS}$ and a drain current $I_D$ when the voltage $V_{DS}$ between the drain electrode 8 and the source electrode 6 is varied under the condition of applying a fixed voltage between the gate electrode 7 and the source electrode 6. This graph clearly demonstrates that the field effect transistor of this example shows favorable characteristics.

EXAMPLE 2

In this example, a field effect transistor was manufactured in the same process as described in Example 1 except that zinc oxide was used in place of tungsten oxide as the photosensitive n-type semiconductor layer 9 and that a gel electrolyte of ammonium oxalate dissolved into polyvinyl alcohol, a water-soluble polymer, was used in place of the dilute sulfuric acid solution as the electrolyte 11.

As a result, a field effect transistor having approximately the same characteristics as Example 1 was obtained.

EXAMPLE 3

An example of forming a wiring pattern is described below.

Figure 4A:
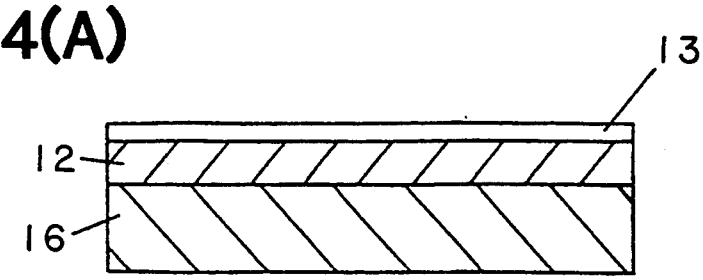
FIGS. 4(A), 4(C) and 4(D) are sectional views illustrating the steps of forming a wiring pattern on a semiconductor substrate according to the patterning method of the present invention, respectively.

Referring to FIG. 4(A), on a silicon substrate 16 was formed an insulating silicon oxide 12, on which a photosensitive n-type semiconductor layer 13 made of zinc oxide was formed by applying a zinc acetate ethanol solution (0.05 mol/dm$^3$) to the insulating silicon oxide 12 and then heat-treating at 400° C. in the air.

Figure 4B:
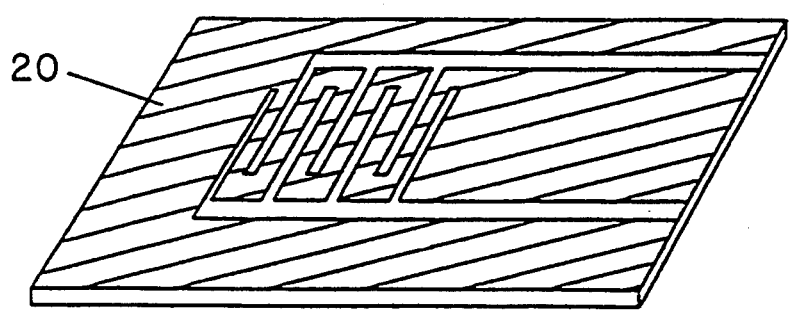
FIG. 4(B) is a perspective view of a photomask used in the above forming process.

While the above multilayer body was kept immersed in an electroless plating catalytic (Pd) solution, a photomask 20 with a desired pattern as shown in FIG. 4(B) was tightly contacted to the photosensitive n-type semiconductor layer 13, and ultraviolet light having energy greater than the band gap of the photosensitive n-type semiconductor layer 13 was radiated on the photomask 20. In this example, the hatching portion on the photomask 20 in FIG. 4(B) is transparent to light.

Figure 4C:
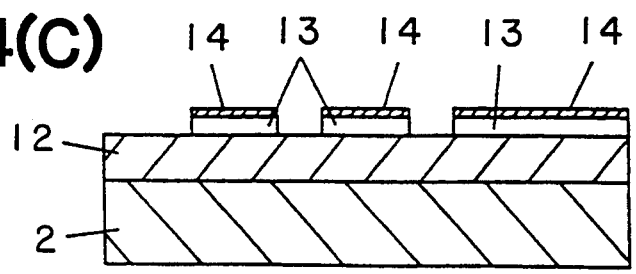

As shown in FIG. 4(C), when ultraviolet light was radiated on the photomask 20, since the electrolyte used in this example was the electroless plating catalytic solution, a portion of the n-type semiconductor layer 13 which had been exposed to light was dissolved into the electrolyte, and at the same time, a layer 14 of Pd, catalyst for electroless plating, was attached to the other portion of the photosensitive n-type semiconductor layer 13 made of zinc oxide which remained unexposed to light.

Figure 4D:
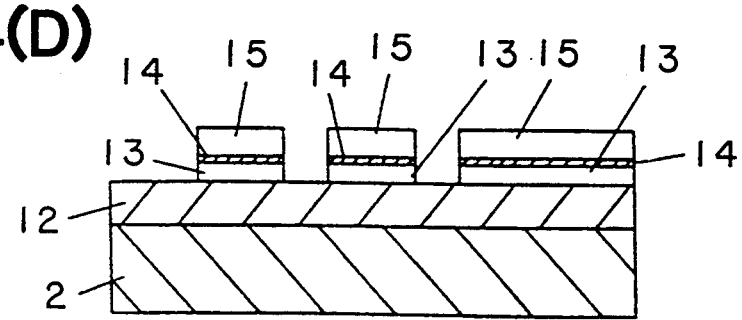

The multilayer body thus obtained was then immersed in an electroless plating gold solution to obtain a gold layer 15 deposited in the same pattern as that of the photomask 20, producing a wiring pattern formed with gold on the silicon substrate as shown in FIG. 4(D).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A patterning method for manufacturing a field effect transistor to form an etching pattern on a ceramic insulating substrate comprising the steps of:

forming a conductive metal layer and a first p-type silicon layer on the ceramic insulating substrate in this order;

forming an n-type silicon layer on the first p-type silicon layer;

forming a second p-type silicon layer on the n-type silicon layer;

forming a photosensitive inorganic semiconductor layer on the second p-type silicon layer;

irradiating a portion of the photosensitive inorganic semiconductor layer, which is kept in contact with an electrolyte, with light having energy greater than the band gap of the photosensitive inorganic semiconductor layer thereby causing the light-irradiated portion of the photosensitive inorganic semiconductor layer to dissolve into the electrolyte by optoelectrochemical reaction, to form a pattern;

forming a source electrode and a drain electrode, both being made of conductive metal, on the n-type silicon layer using said pattern, the second p-type silicon layer being interposed between the source electrode and the drain electrode;

removing a remaining portion of the photosensitive inorganic semiconductor layer with an alkaline cleaning solution; and disposing a gate electrode made of conductive metal on the second p-type silicon layer, wherein the photosensitive inorganic semiconductor layer is selected from the group consisting of tungsten oxide and zinc oxide.

2. A patterning method according to claim 1, wherein the photosensitive inorganic semiconductor layer is zinc oxide, and the electrolyte is a palladium electroless plating catalytic solution.

3. A patterning method according to claim 1, wherein the photosensitive inorganic semiconductor layer is zinc oxide, and the electrolyte is an electrolyte dissolved in a polymer.

4. A patterning method according to claim 1, wherein the photosensitive inorganic semiconductor layer is tungsten oxide, and said electrolyte is a dilute sulfuric acid solution.

* * * * *